United States Patent
Hur (10) Patent No.: US 7,831,405 B2
(45) Date of Patent: Nov. 9, 2010

(54) SEMICONDUCTOR PACKAGE CAPABLE OF PERFORMING VARIOUS TESTS AND METHOD OF TESTING THE SAME

(75) Inventor: Young Do Hur, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 631 days.

(21) Appl. No.: 11/826,665

(22) Filed: Jul. 17, 2007

(65) Prior Publication Data

US 2008/0140334 A1 Jun. 12, 2008

(30) Foreign Application Priority Data

Dec. 7, 2006 (KR) .................... 10-2006-0124056

(51) Int. Cl.
*G06F 19/00* (2006.01)
(52) U.S. Cl. .................................................. 702/120
(58) Field of Classification Search ............... 702/120, 702/117, 118, 182–185
See application file for complete search history.

(56) References Cited

U.S. PATENT DOCUMENTS

| 5,263,031 A | 11/1993 | Inoue |
| 5,687,180 A | 11/1997 | Kawasaki |
| 5,901,105 A | 5/1999 | Ong et al. |
| 6,462,996 B2 * | 10/2002 | Ooishi ................... 365/201 |
| 6,940,765 B2 | 9/2005 | Kyung |

FOREIGN PATENT DOCUMENTS

| JP | 02-188836 | 7/1990 |
| JP | 9106698 | 4/1997 |
| JP | 2000-304831 | 11/2000 |
| JP | 2005071582 | 3/2005 |
| KR | 1019950013606 | 11/1995 |

\* cited by examiner

*Primary Examiner*—Edward Raymond
(74) *Attorney, Agent, or Firm*—Venable LLP; Jeffri A. Kaminski (57) ABSTRACT

A semiconductor package includes an input pin that receives a first signal from the outside of the semiconductor package, a pad that is coupled to the input pin, and a test mode driving circuit that receives the first signal from the pad and outputs a plurality of test mode signals to drive a test apparatus in a semiconductor chip.

24 Claims, 7 Drawing Sheets

SEMICONDUCTOR PACKAGE CAPABLE OF PERFORMING VARIOUS TESTS AND METHOD OF TESTING THE SAME

CROSS-REFERENCE TO RELATED PATENT APPLICATION

This application claims the benefit of Korean Patent Application No. 10-2006-0124056, filed on Oct. 12, 2006, in the Korean Intellectual Property Office, the disclosure of which is incorporated herein in its entirety by reference.

BACKGROUND OF THE INVENTION

1. Technical Field

The present invention relates to a semiconductor package and a method of testing the same, and more particularly, to a semiconductor package on which various tests can be performed and a method of testing the same.

2. Related Art

In general, semiconductor integrated circuits are subjected to test operations in various modes so as to analyze defects and test whether the semiconductor integrated circuits operates as intended.

These tests include a wafer level test that is performed in a wafer state and a package test that is performed in a package state.

The wafer level test is generally performed by test circuits integrated on a wafer using an operational frequency band at a low speed. Meanwhile, the package test is performed by a separate test apparatus using an operational frequency band at a high speed, while a semiconductor package is mounted in the separate test apparatus.

However, the operational frequency bands where the wafer level test and the package test are performed are different from each other. This results in the possibility that semiconductor package may be determined as a normal package during the wafer level test, but determined as a defective package during the package test.

As described above, in regards to the package test, it is not possible to use various test mode circuits that are incorporated in the semiconductor package. For this reason, the semiconductor package is tested by an external test apparatus. However, various defects cannot be detected by the external test apparatus, and this may cause a normal semiconductor package to be determined as a defective semiconductor package if operation errors are generated by the external test apparatus.

SUMMARY

Embodiments of the present invention may provide a semiconductor package on which a package test can be performed in various modes and a method of testing the same.

An embodiment of the present invention may provide a semiconductor package. The semiconductor package includes an input pin that may receive a first signal from the outside of the semiconductor package, a pad that may be coupled to the input pin, and a test mode driving circuit that may receive the first signal from the pad and may output a plurality of test mode signals to drive a test apparatus in a semiconductor chip.

Another embodiment of the present invention may provide a method of testing a semiconductor package. The method includes preparing the semiconductor package that may include an input pin, a pad coupled to the input pin, and a test mode driving circuit to drive a test apparatus through the pad, inputting a first signal to the test mode driving circuit through the input pin and the pad, analyzing the first signal so as to determine whether the semiconductor package enters a test mode or not, and generating test mode signals including information on test types in response to the first signal, when the semiconductor package enters the test mode.

DESCRIPTION OF EXEMPLARY EMBODIMENTS

Embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
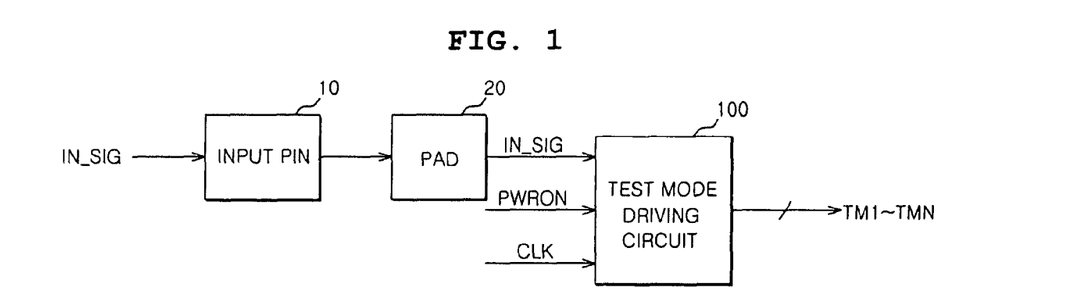
FIG. 1 is a block diagram illustrating an example of a semiconductor memory apparatus that includes an exemplary test mode driving circuit according to an embodiment of the present invention.

Referring to FIG. 1, a semiconductor package according to an embodiment of the present invention may include an input pin 10, a pad 20, and a test mode driving circuit 100.

A first signal IN_SIG may be input to the input pin 10, for example, from the outside of the semiconductor memory apparatus. The first signal IN_SIG may have a plurality of bits. The plurality of bits may be divided into a first bit group and a second bit group, each of which may have a plurality of bits. The first bit group may include information on entering a test mode and the second bit group may include information on test types. In this case, information on entering the test mode may include information indicating when the first signal IN_SIG activates the test mode driving circuit 100 to perform various tests. Information on the test types may include information on test modes depending the particular circuit, among various test modes. For example, the test types may include a test where an operation speed of a sense amplifier is increased, a test in which a specific internal voltage is increased or decreased, and the like.

One of the extra pins of the semiconductor package may be used as the input pin 10. For example, the semiconductor memory apparatus may be designed such that an X8 mode and an X4 mode as data input/output modes are used together. In this case, if the X4 mode is used, extra pins exist. One of the extra pins may be used as the input pin 10. Further, the input pin 10 may use a signal or address input pin that is not used during various test operations.

The pad 20 may be subjected to special bonding together with the input pin 10 to which the first signal IN_SIG is input. In this embodiment, the first signal IN_SIG, which may be input to the semiconductor package from, for example, the outside thereof for the purpose of the test, may be input to the semiconductor package in a package state.

The test mode driving circuit 100 may receive the first signal IN_SIG, a clock signal CLK, and an initializing signal PWRON, and generate a plurality of test mode signals TM1 to TMN. If bit values of the first bit group correspond to predetermined bit values, the test mode driving circuit 100 may decode bit values of the second bit group, and activate and output one of the test mode signals TM1 to TMN in response to the decoding result.

Figure 2:
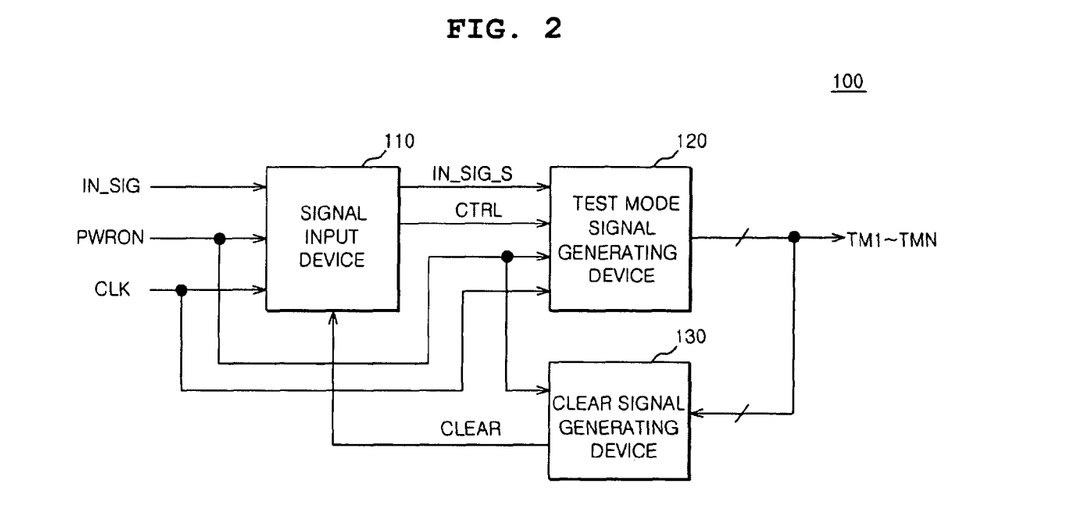
FIG. 2 is an internal block diagram illustrating an exemplary test mode driving circuit shown in FIG. 1.

As shown in FIG. 2, the exemplary test mode driving circuit 100 may include a signal input device 110, a test mode signal generating device 120, and a clear signal generating device 130.

In the disclosed embodiment, signal input device 110 receives the first signal IN_SIG to output a second signal IN_SIG_S and a control signal CTRL in response to a clear signal CLEAR, the initializing signal PWRON, and the clock signal CLK. The test mode signal generating device 120 receives the second signal IN_SIG_S, the initializing signal PWRON, the control signal CTRL, and the clock signal CLK, and outputs the plurality of test mode signals TM1 to TMN. The clear signal generating device 130 outputs the clear signal CLEAR in response to the initializing signal PWRON and the plurality of test mode signals TM1 to TMN.

Figure 3:
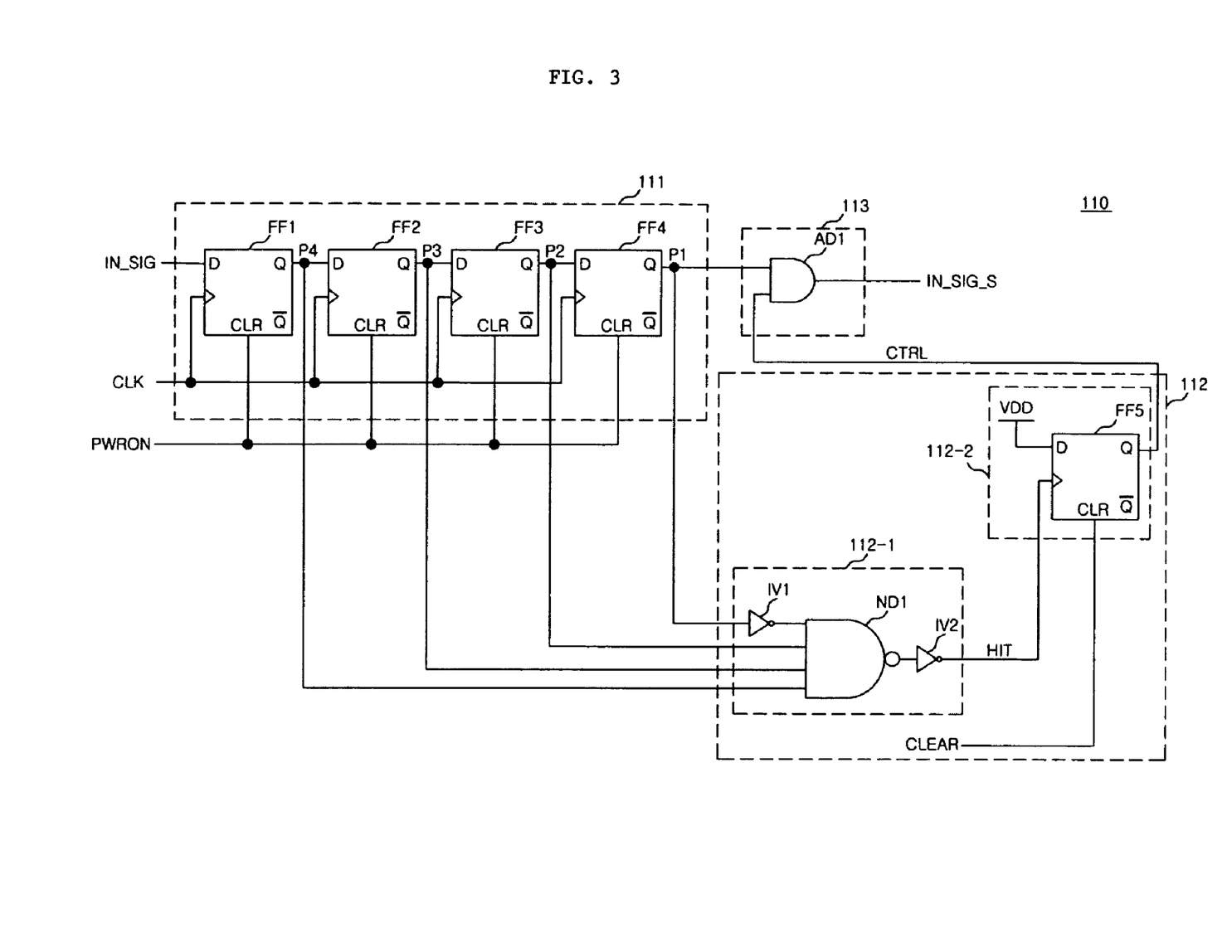
FIG. 3 is an internal circuit diagram illustrating an exemplary signal input device shown in FIG. 2.

As shown in FIG. 3, the exemplary signal input device 110 may include a first shift register 111, a control signal generating unit 112, and a control unit 113.

The first shift register 111 sequentially shifts bit values of the first signal IN_SIG. The control signal generating unit 112 outputs the control signal CTRL in response to output signals P1 to P4 of the first shift register 111 and the clear signal CLEAR. In response to the control signal CTRL, the control unit 113 receives the output signal P1 having the most significant bit among the output signals P1 to P4 of the first shift register 111 and outputs it as the second signal IN_SIG_S.

The first shift register 111 may include, for example, first to fourth flip-flops FF1 to FF4, each of which may be initialized in response to the initializing signal PWRON and outputs a signal input to an input terminal to an output terminal in response to the clock signal CLK. The input terminal of the first flip-flop FF1 may be coupled to the pad 20, and the input terminals of the other flip-flops FF2 to FF4 may be coupled, for example, in series to the output terminals of the flip-flops FF1 to FF3 in previous stages.

The control signal generating unit 112 may include a first signal combining unit 112-1 and a control signal output unit 112-2. The first signal combining unit 112-1 outputs a first driving control signal HIT in response to the output signals P1 to P4 of the first shift register 111. The control signal output unit 112-2 responds to the first driving control signal HIT and the clear signal CLEAR, and receives an external supply voltage VDD, and outputs the control signal CTRL.

The first signal combining unit 112-1 may include a first inverter IV1, a NAND gate ND1, and a second inverter IV2. The first inverter IV1 receives the first output signal P1 among the output signals P1 to P4 of the first shift register 111. The NAND gate ND1 has one input terminal coupled to an output terminal of the first inverter IV1 and other input terminals receiving the second to fourth output signals P2 to P4. The second inverter IV2 has an input terminal coupled to an output terminal of the NAND gate ND1 and an output terminal outputting the first driving control signal HIT.

The control signal output unit 112-2 may include, for example, a fifth flip-flop FF5 that is initialized in response to the clear signal CLEAR, and responds to the first driving control signal HIT and outputs the external supply voltage supplied from an external voltage terminal VDD, which is coupled to an input terminal of the fifth flip-flop FF5, as the control signal CTRL to an output terminal of the fifth flip-flop FF5.

The control unit 113 may include a first AND gate AD1 that receives the control signal CTRL and the first output signal P1 that may have the most significant bit among the output signals P1 to P4 of the first shift register 111, to output the second signal IN_SIG_S. If the control signal CTRL is inactivated, the control unit 113 outputs the second signal IN_SIG_S at a low level regardless of a logic value of the first output signal P1.

Figure 4:
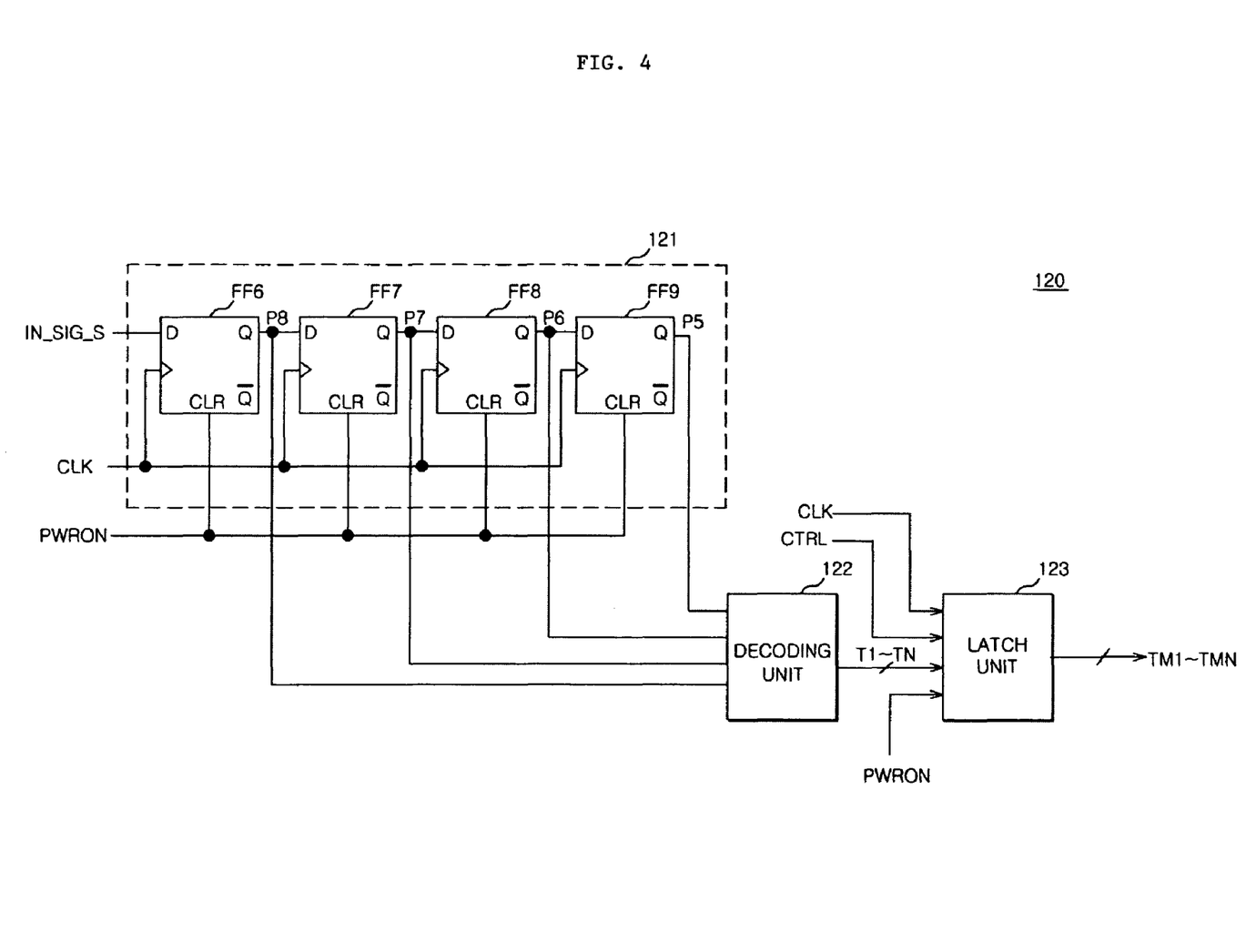
FIG. 4 is an internal circuit diagram illustrating an exemplary test mode signal generating device shown in FIG. 2.

Referring to FIG. 4, the exemplary test mode signal generating device 120 may includes a second shift register 121, a decoding unit 122, and a latch unit 123. The second shift register 121 sequentially shifts bit values of the second signal IN_SIG_S. The decoding unit 122 decodes output signals P5 to P8 of the second shift register 121 and outputs a plurality of mode pulse signals T1 to TN. The latch unit 123 latches one of the plurality of mode pulse signals T1 to TN, which is activated in response to the control signal CTRL, the initializing signal PWRON, and the clock signal CLK, and activates one of test mode signals TM1 to TMN.

N may be a natural number and is set to, for example, 15, for the convenience of explanation. However, the present invention is not limited thereto. That is, if the four output signals P5 to P8 of the second shift register 121 are decoded, sixteen signals are obtained. However, when all of the output signals P5 to P8 of the second shift register 121 are at a low level, it may be determined that the signals have not been input.

The second shift register 121 may include, for example, sixth to ninth flip-flops FF6 to FF9, each of which is initialized in response to the initializing signal PWRON and outputs a signal input to an input terminal to an output terminal in response to the clock signal CLK. Further, the input terminal of the sixth flip-flop FF6 may be coupled to the output terminal of the control unit 113, and the input terminals of the other flip-flops FF7 to FF9 may be coupled, for example, in series to the output terminals of the flip-flops FF6 to FF8 of previous stages.

Figure 5:
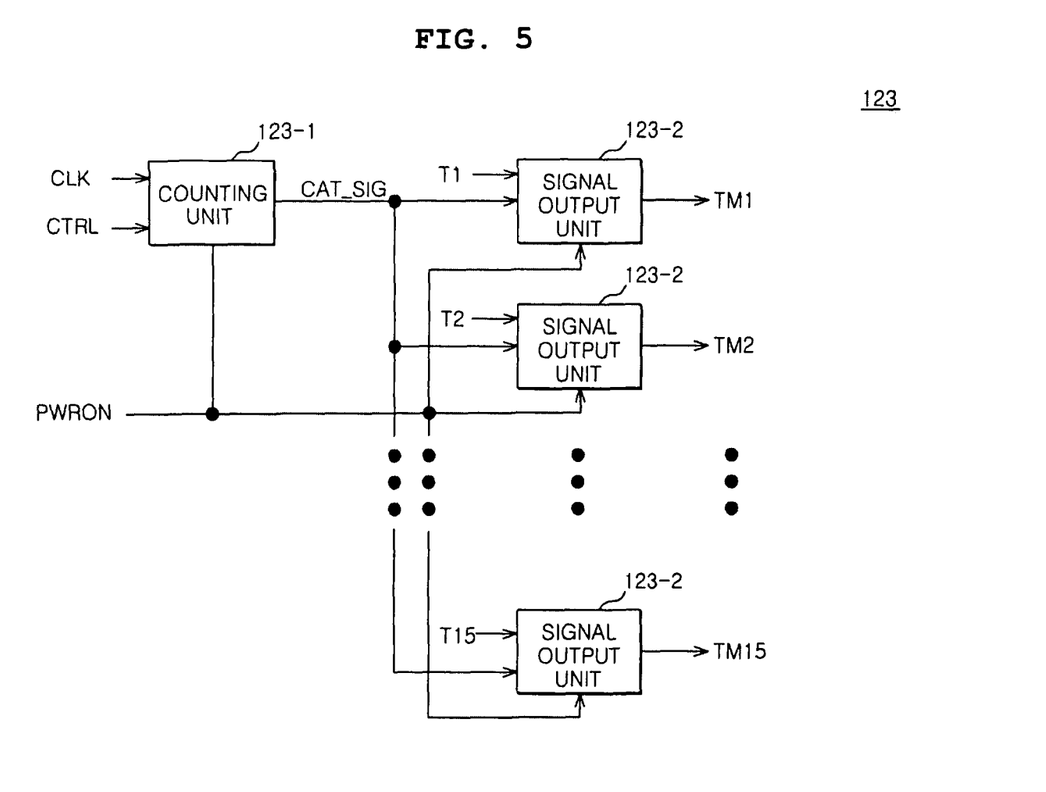
FIG. 5 is an internal circuit diagram illustrating an exemplary latch unit shown in FIG. 4.

As shown in FIG. 5, the latch unit 123 may include a counting unit 123-1 and a plurality of signal output units 123-2. The counting unit 123-1 may be initialized in response to the initializing signal PWRON. The counting unit 123-1 counts an interval where the control signal CTRL is activated in response to the clock signal CLK, and outputs a catch signal CAT_SIG. Each of the signal output units 123-2 may be initialized in response to the initializing signal PWRON, and receives one of the mode pulse signals T1 to T15 in response to the catch signal CAT_SIG and outputs one of the test mode signals TM1 to TM15. At this time, the plurality of mode pulse signals T1 to T15 do not overlap each other.

Figure 6:
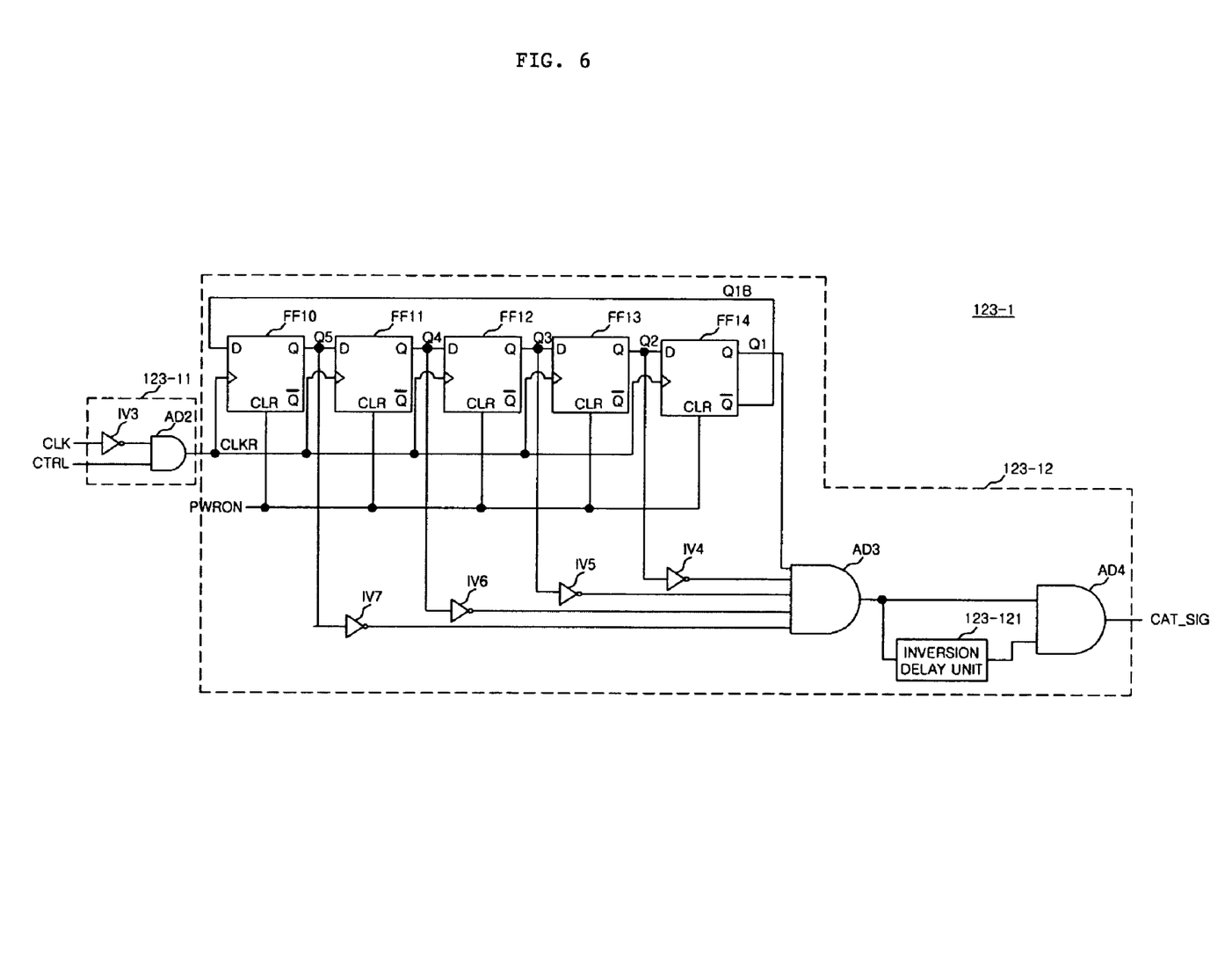
FIG. 6 is an internal circuit diagram illustrating an exemplary counting unit shown in FIG. 5.

As shown in FIG. 6, the counting unit 123-1 may include a second signal combining unit 123-11 and a catch signal output unit 123-12. The second signal combining unit 123-11 may respond to the clock signal CLK and the control signal CTRL and output an inverted signal of the clock signal CLK as a second driving control signal CLKR during an interval where the control signal CTRL is activated. The catch signal output unit 123-12 responds to the initializing signal PWRON and the second driving control signal CLKR and outputs the catch signal CAT_SIG having an activated pulse when the second driving control signal CLKR is finally triggered.

The second signal combining unit 123-11 may include a third inverter IV3 and a second AND gate AD2. The third inverter IV3 inverts the clock signal CLK and the second AND gate AD2 receives the output of the third inverter IV3 and the control signal CTRL and outputs the second driving control signal CLKR.

The catch signal output unit 123-12 may include, for example, tenth to fourteenth flip-flops FF10 to FF14, fourth to seventh inverters IV4 to IV7, a third AND gate AD3, an inversion delay unit 123-21, and a fourth AND gate AD4. The tenth to fourteenth flip-flops FF10 to FF14 may be coupled, for example, in series to each other. Each of the tenth to fourteenth flip-flops FF10 to FF14 may be initialized in response to the initializing signal PWRON, and shifts bit values of an input signal in response to the second driving control signal CLKR. The fourth to seventh inverters IV4 to IV7 invert the output signals Q2 to Q5 of the tenth to thirteenth flip-flops FF10 to FF13, respectively. The third AND gate AD3 receives an output signal Q1 of the fourteenth flip-flop FF14 and output signals of the fourth to seventh inverters IV4 to IV7. The inversion delay unit 123-121 inverts/delays an output signal of the third AND gate AD3. The fourth AND gate AD4 receives an output signal of the third AND gate AD3 and an output signal of the inversion delay unit 123-121 and outputs the catch signal CAT_SIG. In this case, an inversion output signal Q1B of the fourteenth flip-flop FF14 is fed back to the tenth flip-flop FF10.

Figure 7:
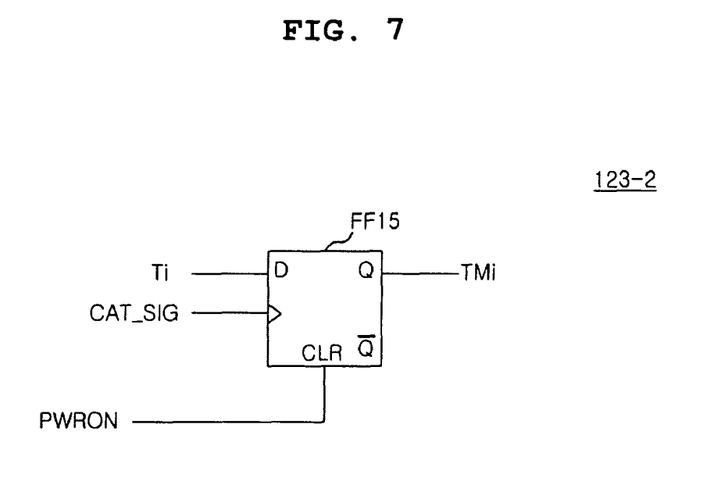
FIG. 7 is an internal circuit diagram illustrating an exemplary signal output unit shown in FIG. 5.

As shown in FIG. 7, each of the signal output units 123-2 may include a fifteenth flip-flop FF15. The fifteenth flip-flop FF15 may be initialized in response to the initializing signal PWRON. Further the fifteenth flip-flop FF15 receives a mode pulse signal Ti in response to the catch signal CAT_SIG, to output a test mode signal TMi. In this case, reference character i denotes a natural number, for example, in a range of 1 to 15.

Figure 8:
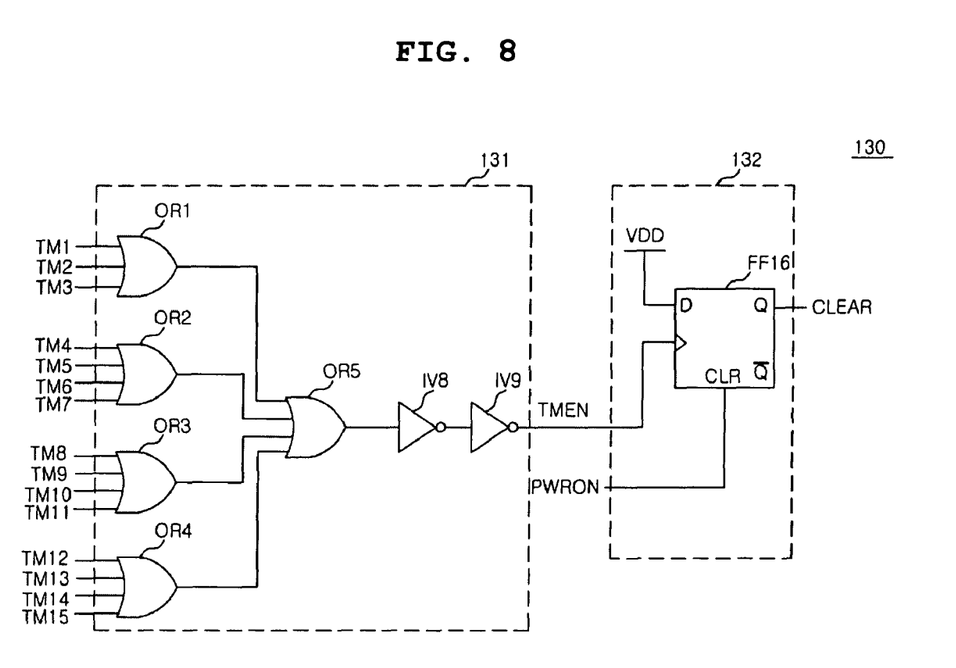
FIG. 8 is an internal circuit diagram illustrating an exemplary clear signal generating device shown in FIG. 2.

As shown in FIG. 8, the exemplary clear signal generating device 130 may include a third signal combining unit 131 and a clear signal output unit 132. If at least one of the plurality of test mode signals TM1 to TM15 is activated, the third signal combining unit 131 may activate a third driving control signal TMEN. In response to the initializing signal PWRON and the third driving control signal TMEN, the clear signal output unit 132 receives the external supply voltage VDD to output the clear signal CLEAR.

The third signal combining unit 131 may include, for example, first to fourth OR gates OR1 to OR4, each of which receives a portion of the test mode signals TM1 to TM15, and a fifth OR gate OR5 that receives the output signals of the first to fourth OR gates OR1 to OR4 to output the third driving control signal TMEN.

As shown in FIG. 8, an eighth inverter IV8 and a ninth inverter IV9 may be included in the third signal combining unit 131 to improve a driving force of the third driving control signal TMEN.

The clear signal output unit 132 may include, for example, a sixteenth flip-flop FF16. The sixteenth flip-flop FF16 may be initialized in response to the initializing signal PWRON. Further, the sixteenth flip-flop FF6 receives the external supply voltage VDD and responds to the third driving control signal TMEN, to output the activated clear signal CLEAR.

Figure 9:
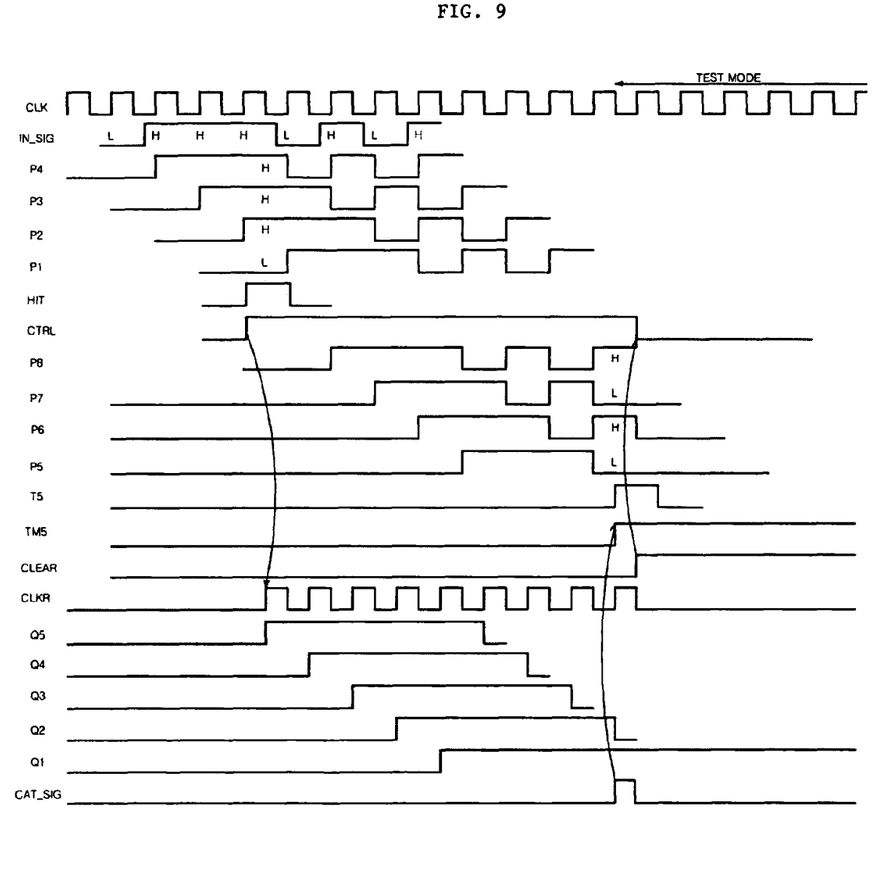
FIG. 9 is a waveform diagram illustrating an exemplary operation of a test mode driving circuit shown in FIG. 2.

Referring to FIG. 9, the first signal IN_SIG that has bit values of, for example, LHHHLHLH (that is, 01110101) may be input. That is, bit values of the first bit group that is included in the first signal IN_SIG may be LHHH, and bit values of the second bit group thereof may be LHLH. In this case, the bit values of the first bit group may include the information on entering the test mode and the bit values of the second bit group may include information on the test types.

The information on the bit values of the first signal IN_SIG synchronizes with the clock signal CLK and is input to the test mode driving circuit 100.

If the bit values of the first bit group correspond to or are the same as predetermined bit values, the control signal CTRL is activated. In this embodiment, the control signal generating unit 112 may be constructed such that the control signal CTRL is activated when the bit values of the first bit group are, for example, LHHH. That is, when the bit values of the first bit group are, for example, LHHH, the test mode driving circuit 100 enters a test mode.

The control unit 113 outputs the bit values LHLH of the second bit group in response to the control signal CTRL.

The test mode signal generating device 120 decodes the bit values LHLH of the second bit group so as to output the mode pulse signal T5. Further, the test mode signal generating device 120 activates and outputs the test mode signal TM5 including the information on the test type in response to the mode pulse signal T5.

An example, of the operation of the semiconductor package according to an embodiment of the present invention will be described in detail with reference to the accompanying drawings.

In this example, the semiconductor package receives the first signal IN_SIG by using the input pin 10 that is not coupled to an internal circuit of a semiconductor chip. The test mode driving circuit in the semiconductor package receives the first signal IN_SIG by using the pad 20 coupled to the input pin 10 and outputs the plurality of test mode signals TM1 to TMN, such that a test operation can be performed in a specific test mode.

The first signal IN_SIG has a plurality of bits. The bits are divided into a first bit group and a second bit group, each of which includes a plurality of bits. The first bit group includes the information on entering the test mode and the second bit group includes the information on the test types. In this embodiment, it is assumed that the first signal IN_SIG, for example, has 8 bits (such as LHHHLHLH, that is, 01110101) the bit values of the first bit group are LHHH, and the bit values of the second bit group are LHLH. However, the number of bits and the bit values in the first signal IN_SIG are not limited to those of this embodiment.

If the first signal IN_SIG is input through the pad 20, the first shift register 111 of the signal input device 110 sequentially shifts the bit values of the first signal IN_SIG in response to the clock signal CLK. In response to the output signals P1 to P4 of the first shift register 111, the control signal generating unit 112 receives the external supply voltage VDD and outputs the control signal CTRL. In response to the control signal CTRL, the control unit 113 receives the first output signal P1 among the output signals P1 to P4 of the first shift register 111 and outputs the second signal IN_SIG_S.

Specifically, if the first shift register 111 sequentially shifts the bit values of the first signal IN_SIG, the control signal generating unit 112 receives the output signals P1 to P4 of the first shift register 111 by using the first signal combining unit 112-1 to output the first driving control signal HIT. The control signal output unit 112-2 operates as follows until the control signal output unit 112-2 receives the activated clear signal CLEAR. In response to the first driving control signal HIT, the control signal output unit 112-2 receives the external supply voltage VDD and outputs the control signal CTRL.

In this embodiment, the control signal generating unit 112 may activate the control signal CTRL at a high level only when the bit values of the first bit group are LHHH in the first signal input.

Referring to FIG. 9, the first to fourth flip-flops FF1 to FF4 that may be included in the first shift register 111 detect the bit values of the first signal IN_SIG at a rising edge of the clock signal CLK and shift the bit values.

If the first shift register 111 shifts the bit values of the first signal IN_SIG four times, a signal having bit values of LHHH is input to the control signal generating unit 112. At this time, the first signal combining unit 112-1 outputs the first driving control signal HIT at a high level. The fifth flip-flop FF5 that receives the first driving control signal HIT outputs the external supply voltage VDD as the control signal CTRL at the rising edge of the first driving control signal HIT. Since the control signal CTRL is activated, the control unit 113 receives the first output signal P1 of the fourth flip-flop FF4 and outputs the second control signal IN_SIG_S.

In the test mode signal generating device 120, the second shift register 121 receives the second signal IN_SIG_S and sequentially shifts the bit values of the second signal IN_SIG_S. The decoding unit 122 receives the output signals P5 to P8 of the second shift register 121 to output the mode pulse signals T1 to T15. In response to the clock signal CLK and the control signal CTRL, the latch unit 123 latches one of the mode pulse signals T1 to T15, and activates/outputs the latched test mode signal TMi (1≦i≦15)

If the decoding unit 122 decodes the output signals P5 to P8 of the second shift register 121 to output the mode pulse signals T1 to T15, the latch unit 123 catches the mode pulse signal T5 that is obtained by decoding the second bit group (having bit values of LHLH), and activates/outputs the test mode signal TM5 in response to the caught mode pulse signal T5.

In the counting unit 123-1, the second signal combining unit 123-11 outputs the second driving control signal CLKR that is output at an inverted level of the clock signal CLK during an interval where the control signal CTRL is activated at a high level. The catch signal output unit 123-12 counts the clock signal CLK in response to the second driving control signal CLKR. At this time, the catch signal output unit 123-12 outputs the catch signal CAT_SIG that is activated if the number of times that the clock signal CLK is counted equals the predetermined number of times.

If the catch signal CAT_SIG is activated, the fifteenth FLIP-FLOP FF15 in the signal output unit 123-2 receives the mode pulse signal T5 in responds to the catch signal CAT_SIG, to output the activated test mode signal TM5.

If the test mode signal TM5 is activated, the third signal combining unit 131 of the clear signal generating device 130 activates/outputs the third driving control signal TMEN. In response to the third driving control signal TMEN, the clear signal output unit 132 outputs the external supply voltage VDD as the clear signal CLEAR at a high level. If the clear signal CLEAR is activated, the fifth flip-flop FF5 that is included in the control signal generating unit 112 is initialized, and thus the control signal CTRL is inactivated at a low level. At this time, the control unit 113 outputs the second signal IN_SIG_S at a low level regardless of signals supplied from the first shift register 111. Thus, the test mode signal TM5 is maintained in an activated state.

In the above-described operation description, the operation timings of the respective signals can be easily understood from FIG. 9.

In this embodiment, after forming of the semiconductor package is finished, if the first signal IN_SIG is applied through the predetermined input pin 10, the first signal IN_SIG is input to the test mode driving circuit 100 that generates the signal for operating the test driving circuit (not shown) in the semiconductor apparatus, through the pad 20 that is subjected to special bonding together with the input pin 10. The test mode driving circuit 100 outputs various test mode signals according to the bit values of the first signal IN_SIG, and various test operations can be performed on the semiconductor package even while in a package state.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor package comprising:
an input pin configured to receive a first signal, having a plurality of bits for testing of the semiconductor package, from outside of the semiconductor package, wherein the input pin is an extra pin of the semiconductor package;
a pad coupled to the input pin; and
a test mode driving circuit configured to receive the first signal from the pad to output a plurality of test mode signals to drive a test apparatus in a semiconductor chip.

2. The semiconductor package of claim 1,
wherein the first signal includes a first bit group and a second bit group, each of which includes a plurality of bits, and
the first bit group includes input information on the first signal and the second bit group includes information on test modes.

3. The semiconductor package of claim 2,
wherein the test mode driving circuit is configured to decode bits of the second bit group if bits of the first bit group correspond to predetermined bit values to obtain a decoding result, and activate the test mode signals in response to the decoding result.

4. The semiconductor package of claim 3,
wherein the test mode driving circuit includes:
a signal input device configured to receive the first signal, and output a second signal and a control signal in response to the first signal, a clear signal, an initializing signal, and a clock signal;
a test mode signal generating device configured to receive the second signal and to output the plurality of test mode signals in response to the second signal, the initializing signal, the control signal, and the clock signal; and
a clear signal generating device configured to output the clear signal in response to the plurality of test mode signals.

5. The semiconductor package of claim 4,
wherein the clear signal generating device includes:
a signal combining unit configured to activate a driving control signal when at least one of the plurality of test mode signals is activated; and
a clear signal output unit configured to respond to the initializing signal and the driving control signal and receive the external supply voltage to output the clear signal.

6. The semiconductor package of claim 5,
wherein the clear signal output unit includes a flip-flop configured to be initialized in response to the initializing signal and receive the external supply voltage in response to the driving control signal to output the activated clear signal.

7. The semiconductor package of claim 4,
wherein the test mode signal generating device includes:
a shift register configured to sequentially shift bits of the second signal to provide output signals;
a decoding unit configured to decode the output signals of the shift register to output a plurality of mode pulse signals; and
a latch unit configured to latch an activated mode pulse signal of the plurality of mode pulse signals in response to the control signal, the initializing signal, and the clock signal, and activates one of the plurality of test mode signals.

8. The semiconductor package of claim 7,
wherein the shift register includes a plurality of flip-flops each including input and output terminals and is configured to be, each of which is initialized in response to the initializing signal and output a signal in response to the clock signal, and
the input terminal of a first flip-flop of the plurality of flip-flops is configured to receive the second signal and the input terminals of the other flip-flops are coupled in series to output terminals of a prior flip-flop in series.

9. The semiconductor package of claim 7,
wherein the decoding unit is configured to inactivate the mode pulse signals when all of the output signals of the shift register are inactivated.

10. The semiconductor package of claim 7,
wherein the latch unit includes:
a counting unit configured to be initialized in response to the initializing signal, count an interval where the control signal is activated in response to the clock signal, to output a catch signal; and
a plurality of signal output units, each of which is configured to be initialized in response to the initializing signal, receive one of the plurality of mode pulse signals in response to the catch signal, and output one of the plurality of test mode signals.

11. The semiconductor package of claim 10,
wherein the counting unit includes:
a signal combining unit configured to respond to the clock signal and the control signal and output an inverted signal of the clock signal as a driving control signal during an interval where the control signal is activated; and
a catch signal output unit configured to respond to the initializing signal and the driving control signal and outputs the catch signal having an activated pulse when the driving control signal is finally triggered.

12. The semiconductor package of claim 11,
wherein the signal combining unit includes:
an inverter configured to invert the clock signal to provide the inverted signal; and
an AND gate configured to receive the inverted signal output of the inverter and the control signal as input and output the driving control signal.

13. The semiconductor package of claim 11,
wherein the catch signal output unit includes:
a plurality of flip-flops coupled in series to each other, each of which is configured to be initialized in response to the initializing signal, and shift bits of an input signal in response to the driving control signal and output the input signal;
a plurality of inverters each of which is configured to invert respective output signals of the plurality of flip-flops and having an output;
a first AND gate having input terminals configured to receive the input signal output signals of the plurality of flip-flops and other input terminals coupled to the outputs of the plurality of inverters to provide an output signal;
an inversion delay unit configured to invert and delay the output signal of the first AND gate to provide an output signal; and
a second AND gate configured to receive the output signal of the first AND gate and the output signal of the inversion delay unit and output the catch signal.

14. The semiconductor package of claim 13,
wherein a first flip-flop of the plurality of flip-flops is configured to receive an inversion output signal of a last flip-flop in series.

15. The semiconductor package of claim 10,
wherein each of the signal output units includes a flip-flop configured to be initialized in response to the initializing signal, and receive one of the mode pulse signals in response to the catch signal, to output one of the test mode signals.

16. The semiconductor package of claim 4,
wherein the signal input device includes:
a shift register configured to sequentially shift the bits of the first signal in response to the clock signal to provide output signals;
a control signal generating unit configured to output the control signal in response to the output signals of the shift register and the clear signal; and
a control unit configured to respond to the control signal, receive the output signal of the shift register that includes a most significant bit, to output the second signal.

17. The semiconductor package of claim 16,
wherein the shift register includes a plurality of flip-flops, each of which includes input and output terminals and is configured to be initialized in response to the initializing signal to output a signal in response to the clock signal, and
the input terminal of a first flip-flop among the plurality of flip-flops is coupled to the pad and respective input terminals of the other flip-flops are coupled in series to respective output terminals of a previous flip-flop in series.

18. The semiconductor package of claim 16,
wherein the control signal generating unit includes:
a signal combining unit configured to output a driving control signal in response to the output signals of the shift register; and
a control signal output unit configured to respond to the driving control signal and the clear signal and receive an external supply voltage to output the control signal.

19. The semiconductor package of claim 18,
wherein the signal combining unit includes:
a first inverter configured to receive one of the output signals of the shift register and that has an output terminal;
a NAND gate having one input terminal coupled to output terminal of the first inverter and other input terminals configured to respectively receive the other output signals of the shift register and an output terminal; and a second inverter having an input terminal coupled to the output terminal of the NAND gate and an output terminal outputting the driving control signal.

20. The semiconductor package of claim 18,
wherein the control signal output unit includes a flip-flop configured to be initialized in response to the clear signal, and receive the external supply voltage, in response to the driving control signal, and output the control signal.

21. The semiconductor package of claim 16,
wherein the control unit includes an AND gate configured to receive one of the output signals of the shift register that includes a most significant bit and the control signal and outputs the second signal.

22. A method of testing a semiconductor package, the method comprising:
preparing the semiconductor package that includes an input pin, a pad coupled to the input pin, and a test mode driving circuit to drive a test apparatus through the pad;
inputting a first signal to the test mode driving circuit through the input pin and the pad;
analyzing the first signal so as to determine whether the semiconductor package enters a test mode; and
generating test mode signals including information on test types in response to the first signal, when the semiconductor package enters the test mode, wherein the first signal includes a plurality of bits, and
the first signal includes a first bit group that has a portion of the plurality of bits and includes information on entering the test mode and a second bit group that has a remaining portion of the plurality of bits and includes information on the test types and wherein the determining of whether the semiconductor package enters the test mode comprises detecting bit information of the first signal, and outputting the bit information in synchronization with the clock signal, detecting whether bit values of the first bit group correspond to predetermined bit values and outputting a control signal based thereon.

23. The method of claim 22,
wherein the generating of the test mode signals comprises receiving the second bit group in response to the control signal, and outputting the test mode signals that correspond to bit values of the second bit group.

24. The method of claim 23,
wherein the generating of the test mode signals includes:
decoding the bit values of the second bit group and outputting mode pulse signals; and
latching and outputting the test mode signals in response to the mode pulse signals.

* * * * *